United States Patent
Lai

(10) Patent No.: US 9,455,270 B1
(45) Date of Patent: Sep. 27, 2016

(54) SEMICONDUCTOR STRUCTURE AND MANUFACTURING METHOD OF THE SAME

(71) Applicant: MACRONIX INTERNATIONAL CO., LTD., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/831,932

(22) Filed: Aug. 21, 2015

(51) Int. Cl.
  *H01L 27/115* (2006.01)
  *H01L 21/768* (2006.01)
  *H01L 21/308* (2006.01)
  *H01L 23/535* (2006.01)

(52) U.S. Cl.
  CPC ..... *H01L 27/11582* (2013.01); *H01L 21/3085* (2013.01); *H01L 21/76897* (2013.01); *H01L 23/535* (2013.01)

(58) Field of Classification Search
  CPC .......... H01L 27/11573; H01L 27/11575; H01L 27/11578; H01L 27/11582; H01L 21/768; H01L 21/76897
  See application file for complete search history.

(56) References Cited

U.S. PATENT DOCUMENTS

| | | | | |
|---|---|---|---|---|
| 2011/0180941 | A1* | 7/2011 | Hwang | H01L 27/11575 257/786 |
| 2012/0286345 | A1* | 11/2012 | Seo | H01L 27/11573 257/315 |
| 2014/0264621 | A1* | 9/2014 | Lee | H01L 27/11531 257/369 |
| 2015/0009759 | A1* | 1/2015 | Lai | G11C 16/06 365/185.17 |
| 2016/0093626 | A1* | 3/2016 | Izumi | H01L 21/7688 257/324 |
| 2016/0111366 | A1* | 4/2016 | Lai | H01L 23/5283 257/773 |
| 2016/0204122 | A1* | 7/2016 | Shoji | H01L 27/11582 257/324 |

OTHER PUBLICATIONS

Kim, et al.: "Novel 3-D Structure for Ultra High Density Flash Memory with VRAT (Vertical-Recess-Array-Transistor) and PIPE (Planarized Integration on the same PlanE)"; 978-1-4244-1805-3/08/$25.00 © 2008 IEEE; 2008 Symposium on VLSI Technology Digest of Technical Papers; pp. 122-123.

* cited by examiner

*Primary Examiner* — Christine Enad
(74) *Attorney, Agent, or Firm* — McClure, Qualey & Rodack, LLP

(57) ABSTRACT

A semiconductor structure and a manufacturing method of the same are provided. The semiconductor structure includes a substrate having a trench, a stacked structure, an etching stop structure, a plurality of memory structure, and a first filled slit groove formed in the stacked structure. The stacked structure has a horizontal extended region and a vertical extended region extending along a sidewall of the trench. The stacked structure includes a plurality of conductive layer s and a plurality of insulating layers interlacedly stacked in the trench. The etching stop structure is formed in the vertical extended region. The memory structures vertically penetrate through the conductive layers and the insulating layers in the horizontal extended region. The conductive layers and the insulating layers in the vertical extended region are formed on the etching stop structure and located between the etching stop structure and the first filled slit groove.

20 Claims, 17 Drawing Sheets

SEMICONDUCTOR STRUCTURE AND MANUFACTURING METHOD OF THE SAME

BACKGROUND

1. Technical Field

The disclosure relates in general to a semiconductor structure and a manufacturing method thereof, and particularly to a semiconductor structure with an etching stop structure and a manufacturing method thereof.

2. Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and a simplified manufacturing method thereof are in need.

As such, it is desirable to develop a three-dimensional (3D) memory device with larger number of multiple stacked planes to achieve greater storage capacity, improved qualities and stabilities, simplified manufacturing process, and yet remaining a small size.

SUMMARY

The present disclosure relates in general to a semiconductor structure and a manufacturing method thereof. In the semiconductor structure of the embodiments, the conductive layers in the vertical extended region are formed on the etching stop structure, such that the conductive layers in the vertical extended region can be nicely supported by the etching stop structure for providing excellent and stable electrical contact between the stacked structure and the contact plugs.

According to an embodiment of the disclosure, a semiconductor structure is provided. The semiconductor structure includes a substrate, a stacked structure, an etching stop structure, a plurality of memory structures, and a first filled slit groove. The substrate has a trench. The stacked structure has a horizontal extended region and a vertical extended region extending along a sidewall of the trench. The stacked structure includes a plurality of conductive layers and a plurality of insulating layers interlacedly stacked in the trench. The etching stop structure is formed in the vertical extended region. The memory structures vertically penetrate through the conductive layers and the insulating layers in the horizontal extended region of the stacked structure. The first filled slit groove is formed in the stacked structure, wherein the conductive layers and the insulating layers in the vertical extended region are formed on the etching stop structure and located between the etching stop structure and the first filled slit groove.

According to another embodiment of the disclosure, a manufacturing method of a semiconductor structure is provided. The manufacturing method of the semiconductor structure includes the following steps: providing a substrate having a trench; forming a stacked structure having a horizontal extended region and a vertical extended region extending along a sidewall of the trench, wherein the stacked structure comprises a plurality of conductive layers and a plurality of insulating layers interlacedly stacked in the trench; forming an etching stop structure in the vertical extended region; forming a plurality of memory structures vertically penetrating through the conductive layers and the insulating layers in the horizontal extended region of the stacked structure; and forming a first filled slit groove in the stacked structure, wherein the conductive layers and the insulating layers in the vertical extended region are formed on the etching stop structure and located between the etching stop structure and the first filled slit groove.

The above and other aspects of the disclosure will become better understood with regard to the following detailed description of the non-limiting embodiment(s). The following description is made with reference to the accompanying drawings.

DETAILED DESCRIPTION

Figure 1:
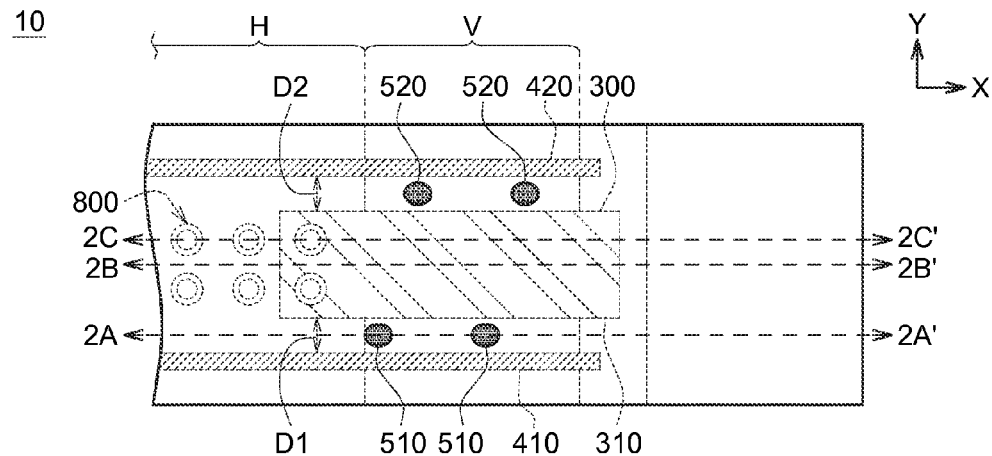
FIG. 1 shows a top view of a semiconductor structure according to an embodiment of the present disclosure.

In the embodiments of the present disclosure, a semiconductor structure and a method of manufacturing the same are provided. In the semiconductor structure of the embodiments, the conductive layers in the vertical extended region are formed on the etching stop structure, such that the conductive layers in the vertical extended region can be nicely supported by the etching stop structure for providing excellent and stable electrical contact between the stacked structure and the contact plugs. The following embodiments are for the purpose of elaboration only, not for limiting the scope of protection of the invention. Besides, some of the secondary elements are omitted in the drawings accompanying the following embodiments to highlight the technical features of the invention.

Figure 2A:
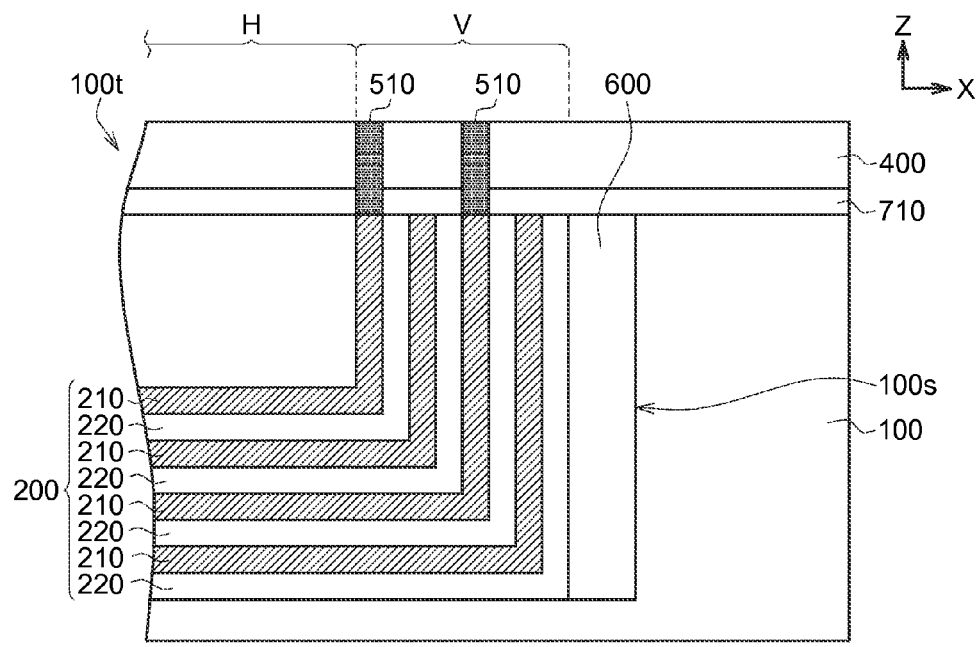
FIG. 2A is a cross-sectional view along the cross-sectional line 2A-2A' in FIG. 1.
Figure 2B:
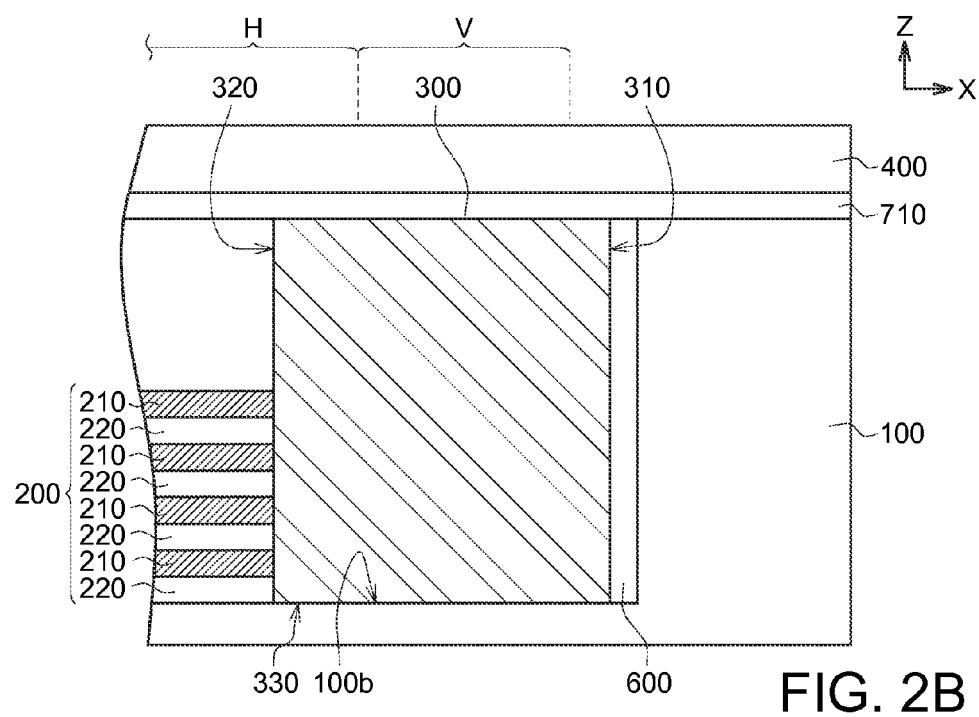
FIG. 2B is a cross-sectional view along the cross-sectional line 2B-2B' in FIG. 1.
Figure 2C:
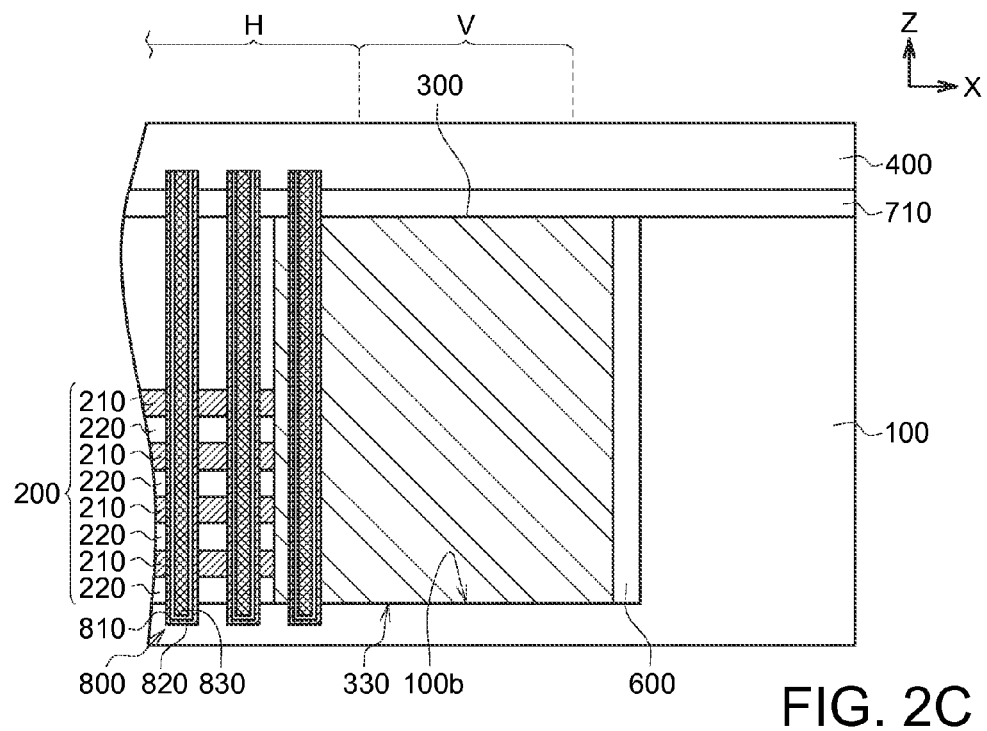
FIG. 2C is a cross-sectional view along the cross-sectional line 2C-2C' in FIG. 1.

Referring to FIGS. 1, 2A-2C, FIG. 1 shows a top view of a semiconductor structure 10 according to an embodiment of the present disclosure, FIG. 2A is a cross-sectional view along the cross-sectional line 2A-2A' in FIG. 1, FIG. 2B is a cross-sectional view along the cross-sectional line 2B-2B' in FIG. 1, and FIG. 2C is a cross-sectional view along the cross-sectional line 2C-2C' in FIG. 1. In the embodiments, the semiconductor structure 10 is such as a main structure of a three-dimensional (3D) memory device.

As shown in FIGS. 1 and 2A-2C, the semiconductor structure 10 includes a substrate 100, a stacked structure 200, an etching stop structure 300, a plurality of memory structures 800, and a first filled slit groove 410. The substrate 100 has a trench 100t (please refer to FIG. 3 as well). The stacked structure 200 has a horizontal extended region H and a vertical extended region V extending along a sidewall 100s of the trench 100t. The stacked structure 200 includes a plurality of conductive layers 210 and a plurality of insulating layers 220 interlacedly stacked in the trench 100t. The etching stop structure 300 is formed in the vertical extended region V. The memory structures 800 vertically penetrate through the conductive layers 210 and the insulating layers 220 in the horizontal extended region H of the stacked structure 200. The first filled slit groove 410 is formed in the stacked structure 200. The conductive layers 210 and the insulating layers 220 in the vertical extended region V are formed on the etching stop structure 300 and located between the etching stop structure 300 and the first filled slit groove 410.

In the embodiment, the conductive layers 210 and the insulating layers 220 in the vertical extended region V are formed on the etching stop structure 300 and located between the etching stop structure 300 and the first filled slit groove 410, such that the conductive layers 210 extending vertically along the Z direction can be nicely supported by the etching stop structure 300, the conductive layer 210 would not deform or collapse, and thus excellent and stable electrical contact between the stacked structure 200 and contact plugs can be provided.

In the embodiment, as shown in FIGS. 1, 2A-2C, the semiconductor structure 10 may further optionally include an oxide spacer 600. The oxide spacer 600 is located between the stacked structure 200 and the sidewall 100s of the trench 100t, and located between a first sidewall 310 of the etching stop structure 300 and the sidewall 100s of the trench 100t.

In another embodiment, the semiconductor structure 10 may not include an oxide spacer (not shown in drawings), and the first sidewall 310 of the etching stop structure 300 is adjacent to the sidewall 100s of the trench 100t. In other words, the etching stop structure 300 may extend to and in contact with the sidewall 100s of the trench 100t.

In the embodiment, as shown in FIGS. 1 and 2B-2C, a second sidewall 320 of the etching stop structure 300 may be located in the horizontal extended region H of the stacked structure 200.

In the embodiment, as shown in FIGS. 1 and 2B-2C, a bottom surface 330 of the etching stop structure 300 may be in direct contact with a bottom surface 100b of the trench 100t.

In other words, the etching stop structure 300 can cover the X-Z cross-section of the vertical extended region V of the stacked structure 200, and the conductive layers 210 located on two sides of the etching stop structure 300 along the Y direction are separated by the etching stop structure 300.

In the embodiment, as shown in FIG. 1, the etching stop structure 300 and the first filled slit groove 410 are separated by a distance D1 of such as 20-200 nm. In the embodiment, the cross-sectional width of the memory structure 800 is such as 5-100 nm.

In the embodiment, as shown in FIGS. 2A-2C, the semiconductor structure 10 may include a dielectric structure 400 and a plurality of contact plugs 510/520. The dielectric structure 400 is formed on the substrate 100 and the stacked structure 200. The contact plugs 510/520 are formed in the dielectric structure 400. Each of the contact plugs 510/520 is electrically connected to each of the conductive layers 210 in the vertical extended region V of the stacked structure 200 respectively.

In the embodiment, as shown in FIG. 1, the semiconductor structure 10 may further include a second filled slit groove 420. The second filled slit groove 420 is formed in the stacked structure 200. The etching stop structure 300 is located between the first filled slit groove 410 and the second filled slit groove 420. In the embodiment, the etching stop structure 300 and the second filled slit groove 420 are separated by a distance D2 of such as 20-200 nm.

In an embodiment, the first filled slit groove 410 and the second filled slit groove 420 may respectively include an insulating layer and a conductive filler, wherein the insulating layer is formed on the surface of a slit groove, and the conductive filler is formed on the insulating layer and fills the slit groove. In the embodiment, the insulating layer is such as a silicon oxide layer, and the conductive filled is such as titanium nitride (TiN) and tungsten, wherein the TiN layer is formed on the insulating layer, and tungsten is formed on the TiN layer and fills up the slit groove. In another embodiment, the first filled slit groove 410 and the second filled slit groove 420 may respectively include an insulating filler. In the embodiment, the distance between the first filled slit groove 410 and the second filled slit groove 420 is such as about 100 μm.

In the embodiment, the conductive layers 210 and the insulating layers 220 in the vertical extended region V of the stacked structure 200 may be further located between the etching stop structure 300 and the second filled slit groove 420.

In the embodiment, the conductive layers 210 and the insulating layers 220 are formed on the etching stop structure 300 and in direct contact with the etching stop structure 300. Despite that the conductive layers 210 and the insulating layers 220 vertically extend along the Z direction and have very small thicknesses along the X direction, the conductive layers 210 and the insulating layers 220 can still be nicely supported by the etching stop structure 300, and the conductive layers 210 would not deform or collapse, such that excellent electrical contact between the stacked structure 200 and the contact plugs 510/520 is provided, and the stability of the semiconductor structure 10 is further improved.

In the embodiment, the conductive layers 210 in the horizontal extended region H of the stacked structure 200 may include polysilicon, tungsten, or a combination of both, and the conductive layers 210 in the vertical extended region V of the stacked structure 200 may include tungsten. The conductive layers 210 in the vertical extended region V are electrically connected to the contact plugs 510/520, and tungsten has a much smaller resistance than polysilicon does, such that the conductive layers 210 in the vertical extended region V including tungsten may largely decrease the resistance of the stacked structure at the pickup region.

In the embodiments, the semiconductor structure is such as a main structure of a 3D memory structure, and the conductive layers 210 are such as word lines.

Figure 1A:
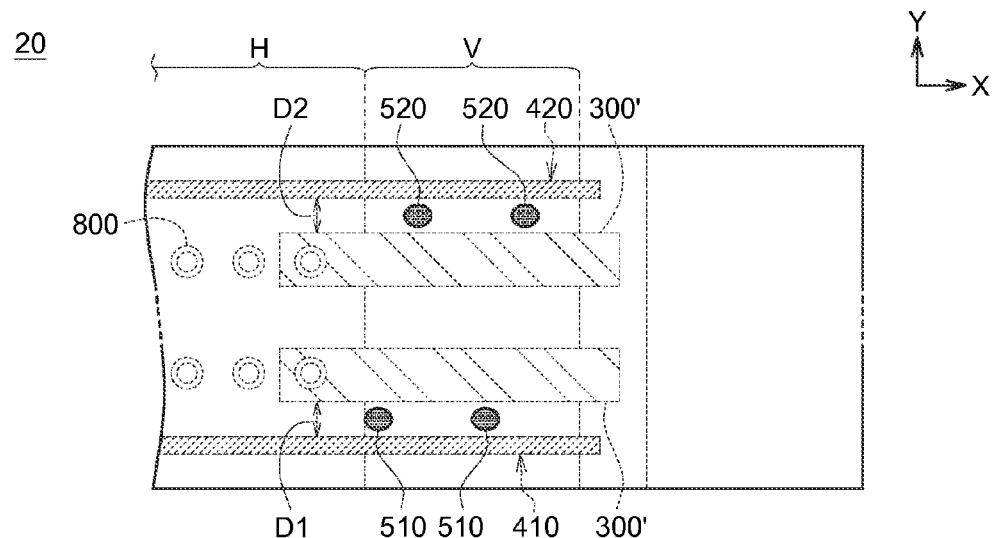
FIG. 1A shows a top view of a semiconductor structure according to another embodiment of the present disclosure.

FIG. 1A shows a top view of a semiconductor structure 20 according to another embodiment of the present disclosure. The elements in the present embodiment sharing similar or the same labels with those in the previous embodiment are similar or the same elements, and the description of which is omitted.

As shown in FIG. 1A, in the embodiment, the etching stop structure 300 may include a plurality of etching stop blocks 300'. Among the etching stop blocks 300', the one etching stop block 300' located nearest to the first filled slit groove 410 is separated from the first filled slit groove 410 by a distance D1 of about 20-200 nm, and the one etching stop block 300' located nearest to the second filled slit groove 420 is separated from the second filled slit groove 420 by a distance D2 of about 20-200 nm.

FIGS. 3-13A illustrate a process for manufacturing a semiconductor structure according to an embodiment of the present disclosure.

Figure 3:
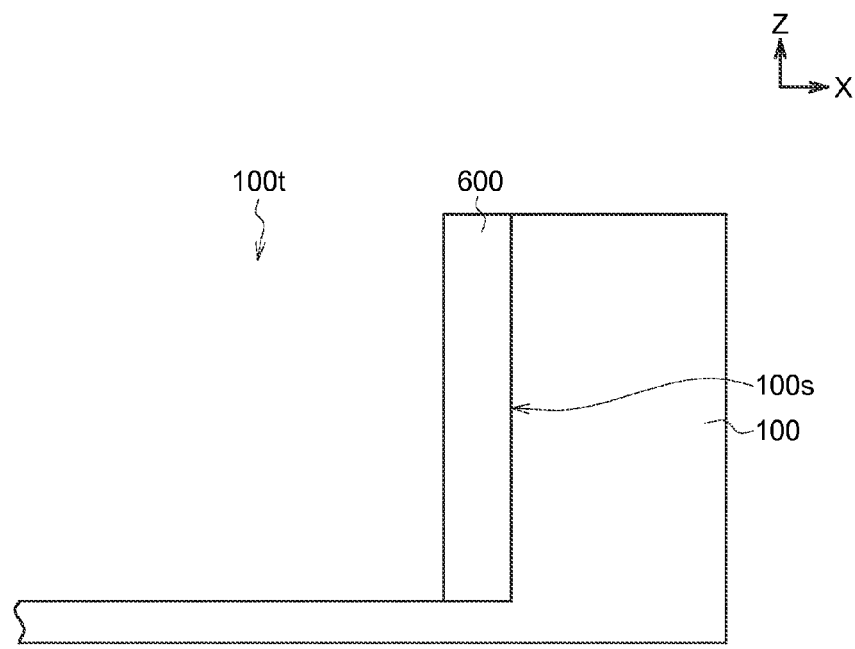
FIGS. 3-13A illustrate a process for manufacturing a semiconductor structure according to an embodiment of the present disclosure.

As shown in FIG. 3, the substrate 100 having the trench 100t is provided. In the embodiment, for example, an etching process may be performed to form the trench 100t in the substrate 100. In the embodiment, an oxide spacer 600 may be optically formed on the sidewall 100s of the trench 100t.

Figure 4:
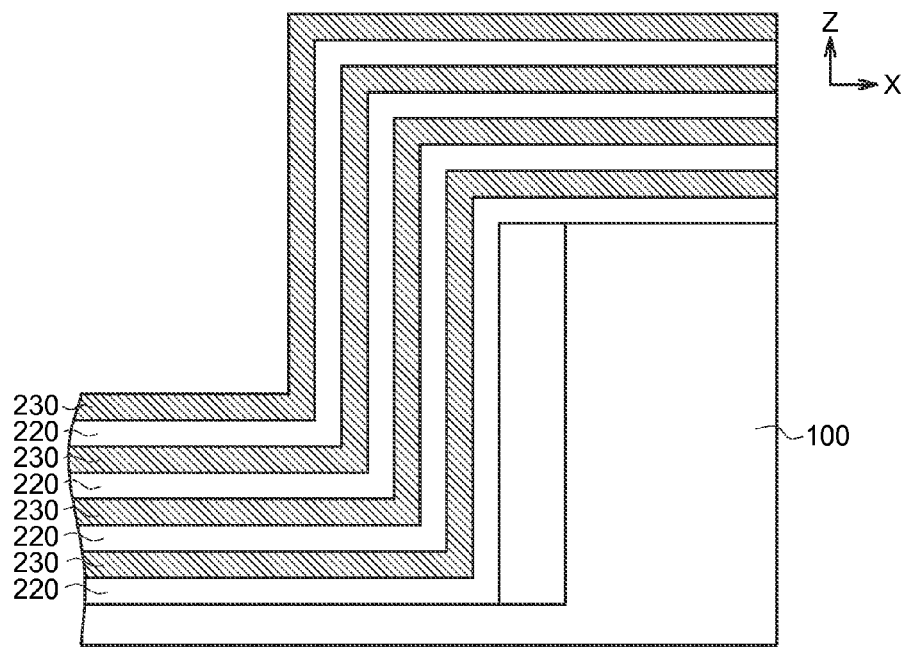
Figure 5:
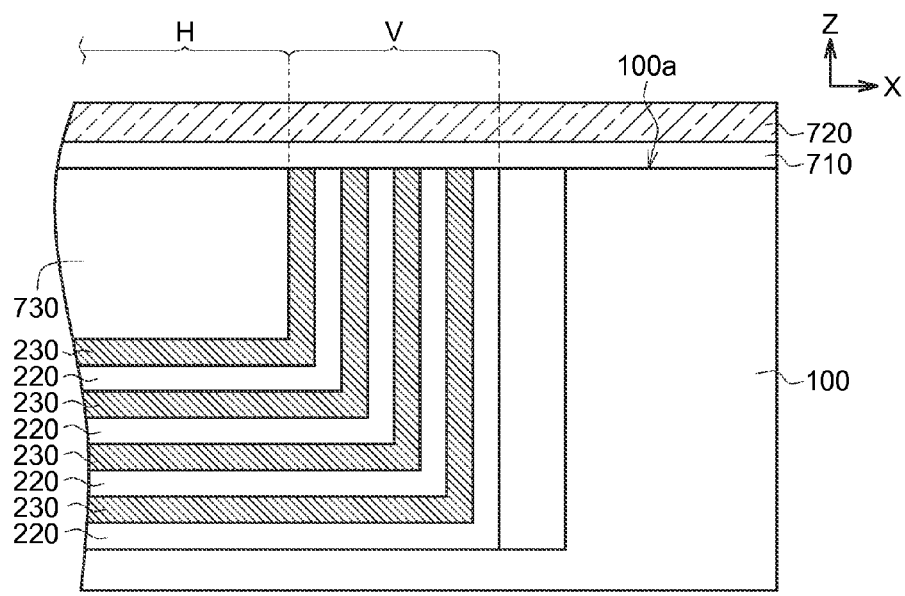

As shown in FIGS. 4-5, a stacked structure is formed in the trench 100t. In the embodiment, the manufacturing method of forming a stacked structure in the trench 100t includes such as the following steps.

As shown in FIG. 4, material layers 230 and insulating layers 220 may be formed and interlacedly stacked in the trench 100t and on the substrate 100. In the embodiment, the material layer 230 may be a conductive material layer or a sacrificial layer. The conductive material layer may include such as polysilicon, and the sacrificial layer may include such as silicon nitride (SiN), silicon oxynitride (SiON), silicon carbonitride (SiCN), or any combinations thereof. In the present embodiment, the insulating layer 220 is a silicon oxide layer, and the material layer 230 is a sacrificial layer, of which the material is silicon nitride.

As shown in FIG. 5, the material layers 230 and the insulating layers 220 are planarized, such that the material layers 230 and the insulating layers 220 are coplanar with the top surface 100a of the substrate 100. Next, a dielectric material 730 is formed on the material layers 230 and the insulating layers 220, and a cap layer 710 and a hard mask layer 720 are formed on the planarized material layers 230 and insulating layers 220 and the top surface 100a of the substrate 100. In the embodiment, the cap layer 710 is such as a silicon oxide layer, and the hard mask layer 720 is such as silicon nitride layer. As such, the stacked structure 5200 as shown in FIG. 5 is formed. The stacked structure 5200 has a horizontal extended region H and a vertical extended region V extending along the sidewall 100s of the trench 100t. The material layers 230 and the insulating layers 220 are interlacedly stacked in the trench 100t. The stacked structure 200 will be formed after the material layers 230 are replaced by conductive materials in the subsequent steps.

Figure 6:
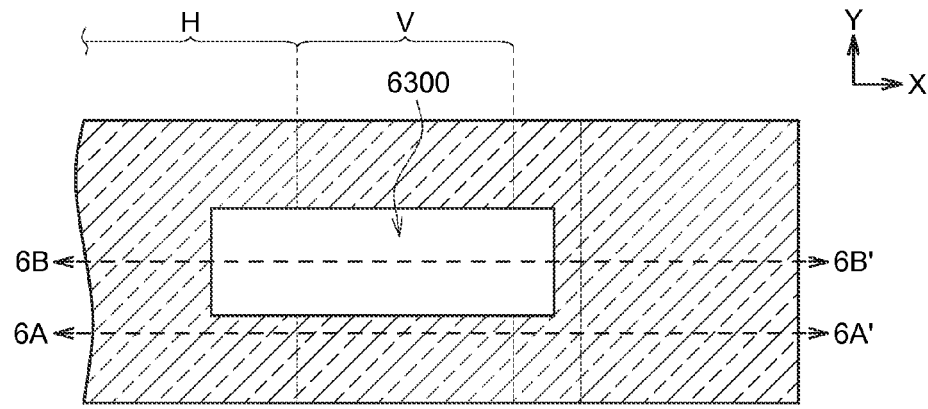
Figure 7:
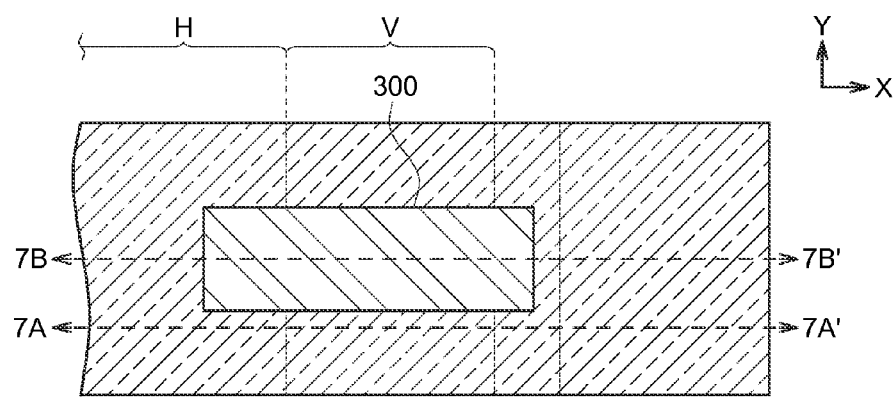
Figure 7A:
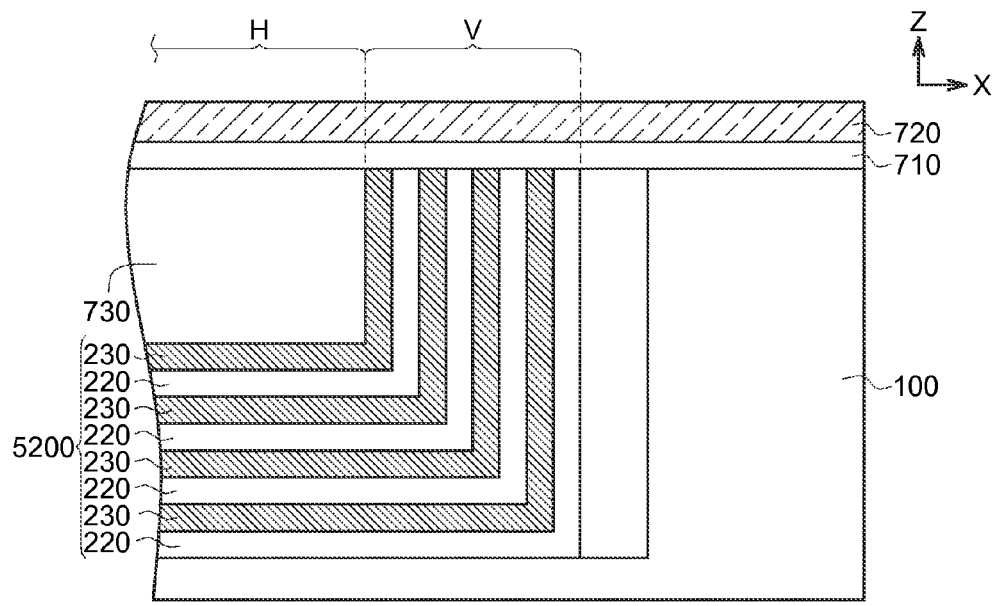
Figure 7B:
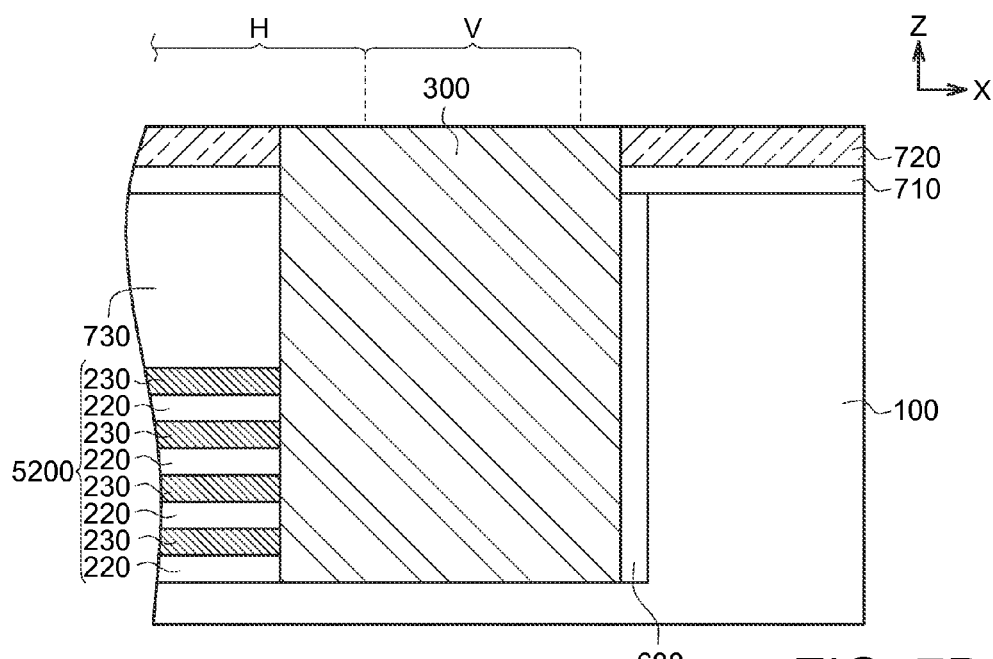

As shown in FIGS. 6-7B, the etching stop structure 300 is formed in the vertical extended region V of the stacked structure 5200. The manufacturing method of the etching stop structure 300 includes such as the following steps.

Figure 6A:
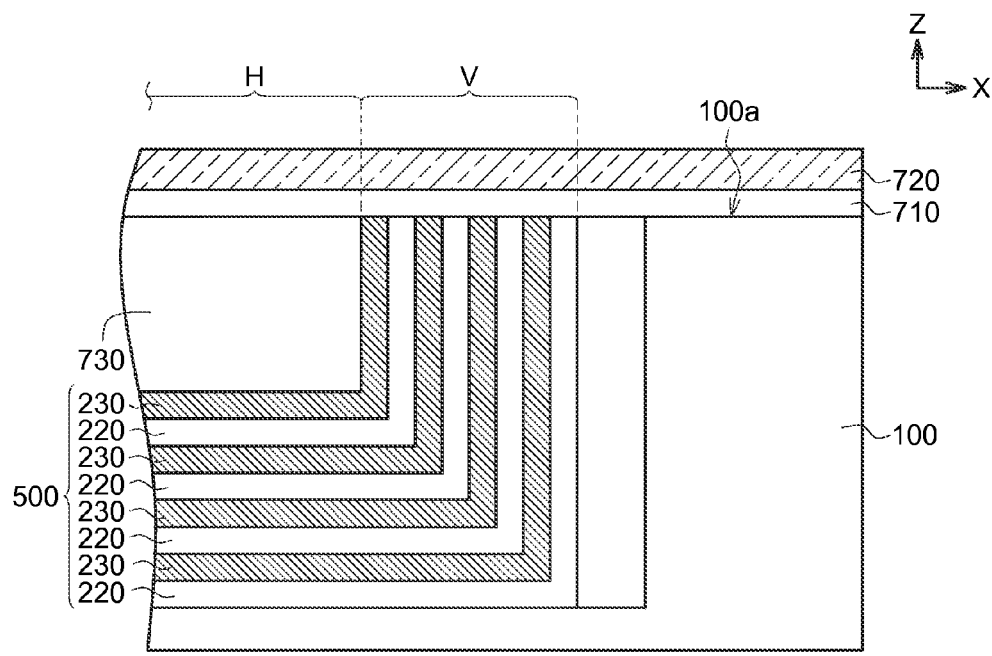
Figure 6B:
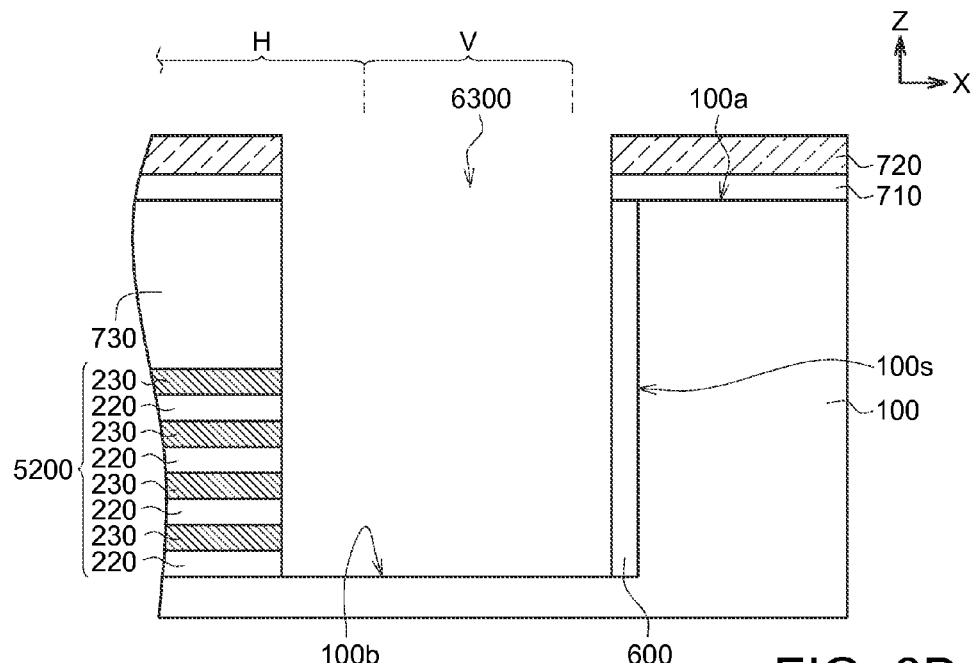

FIG. 6A is a cross-sectional view along the cross-sectional line 6A-6A' in FIG. 6, and FIG. 6B is a cross-sectional view along the cross-sectional line 6B-6B' in FIG. 6. As shown in FIGS. 6-6B, a trench 6300 is formed in the vertical extended region V of the stacked structure 5200. In the embodiment, the trench 6300 is formed by such as an etching process, and the etching process has no etching selectivity with respect to the material layers 230 and the insulating layers 220.

As shown in FIGS. 6 and 6B, in the embodiment, an end of the trench 6300 can extend toward the oxide spacer 600, and an opposite end of the trench 6300 can extend into the horizontal extended region H. In an alternative embodiment, an end of the trench 6300 may even extend to expose the sidewall 100s of the trench 100t (not shown in drawings). In addition, in the embodiment, the bottom of the trench 6300 can expose the bottom surface 100b of the trench 100t.

FIG. 7A is a cross-sectional view along the cross-sectional line 7A-7A' in FIG. 7, and FIG. 7B is a cross-sectional view along the cross-sectional line 7B-7B' in FIG. 7. As shown in FIGS. 7-7B, an etching stop material is filled in the trench 6300 for forming the etching stop structure 300. After the etching stop material is filled in the trench 6300, a chemical mechanical polishing (CMP) process may be further performed to planarize the surface of the etching stop structure 300.

Figure 8:
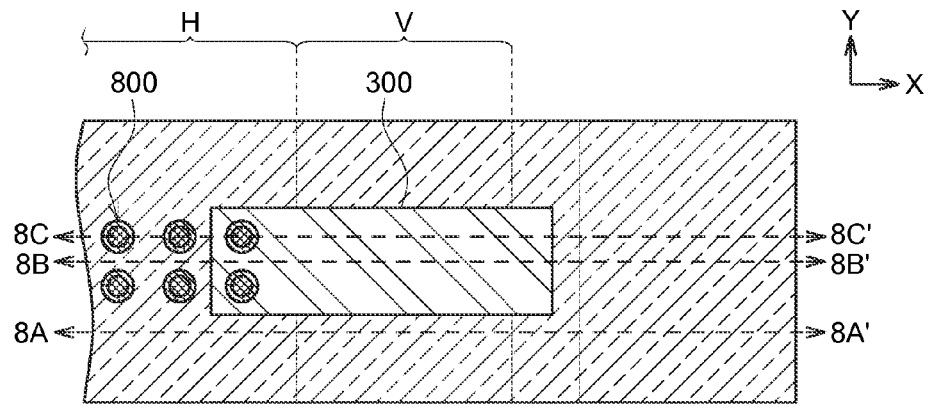
Figure 8A:
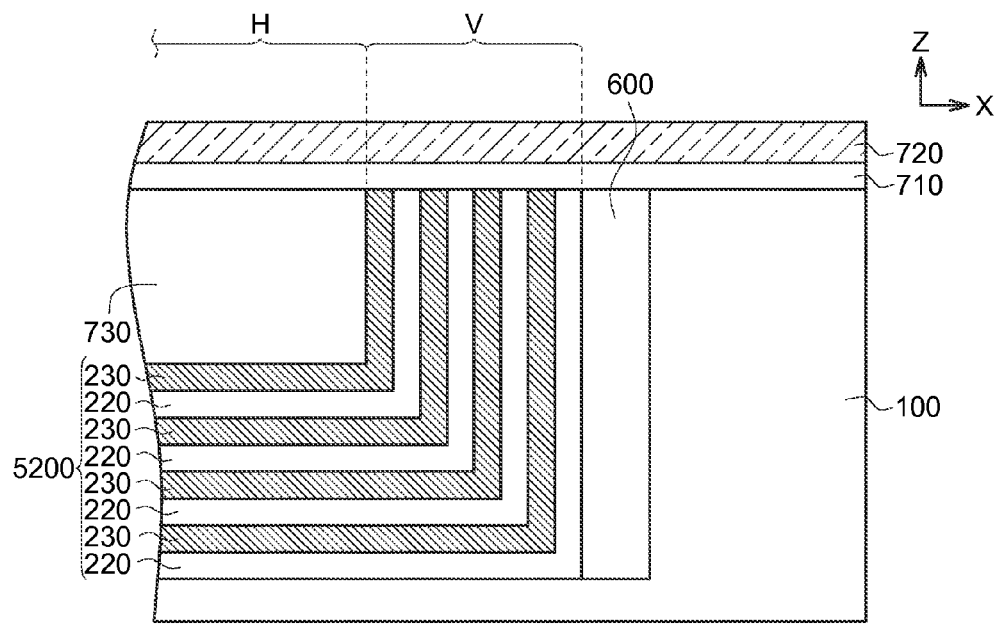
Figure 8B:
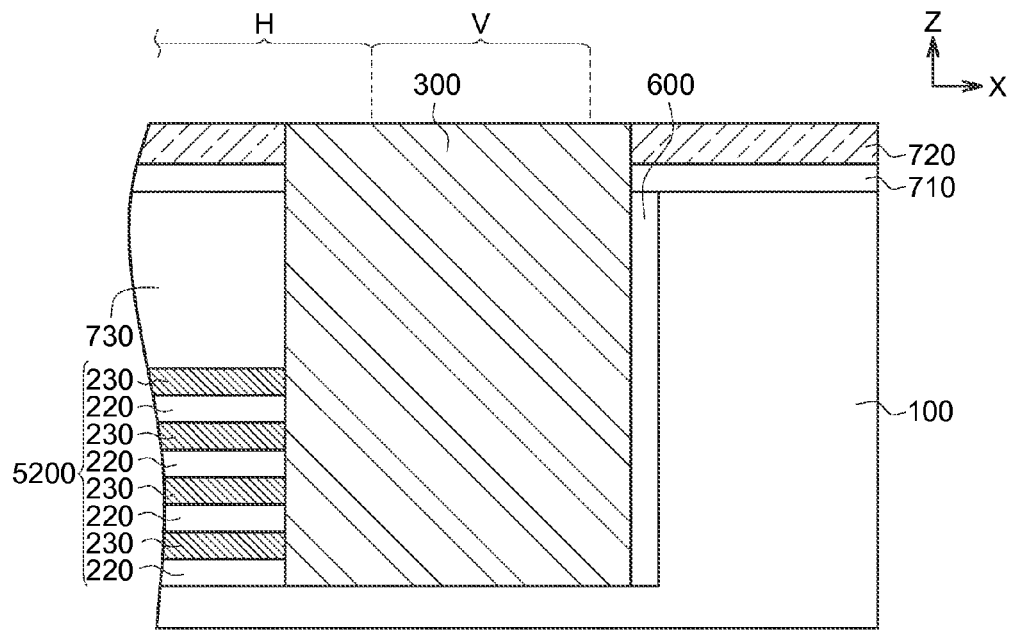
Figure 8C:
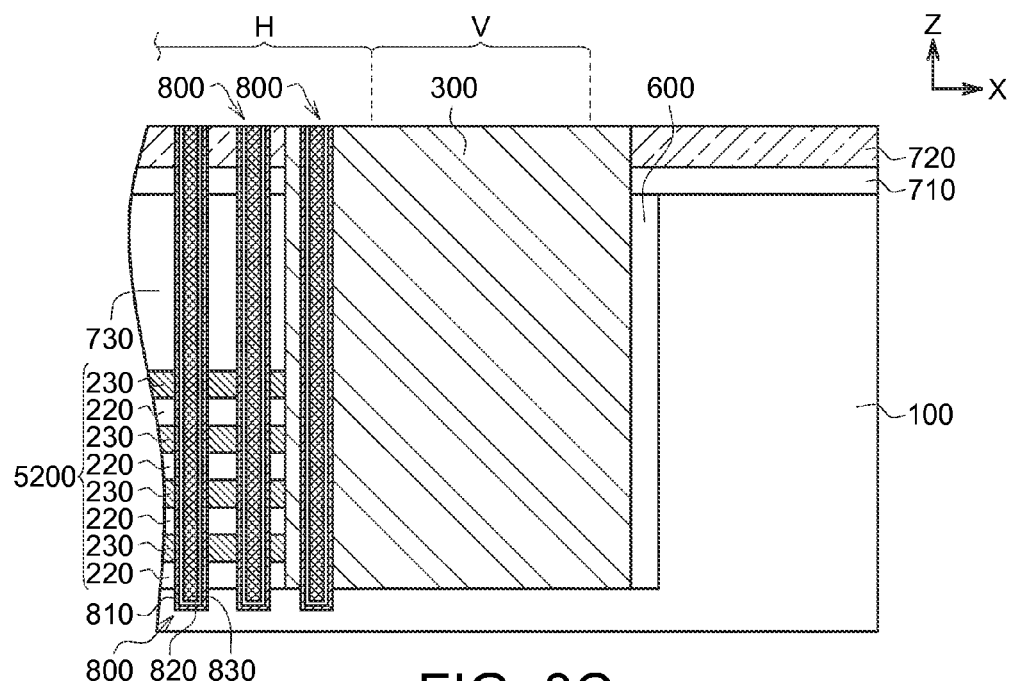

FIG. 8A is a cross-sectional view along the cross-sectional line 8A-8A' in FIG. 8, FIG. 8B is a cross-sectional view along the cross-sectional line 8B-8B' in FIG. 8, and FIG. 8C is a cross-sectional view along the cross-sectional line 8C-8C' in FIG. 8. As shown in FIGS. 8-8C, the memory structures 800 are formed. In the current step, the as-formed memory structures 800 vertically penetrate through the material layers 230 and the insulating layers 220 in the horizontal extended region H of the stacked structure 5200. After the material layers 230 are replaced by conductive materials in the subsequent steps, these memory structures 800 vertically penetrate through the conductive layers 210 and the insulating layers 220 in the horizontal extended region H of the stacked structure 200.

As shown in FIGS. 8-8C, the manufacturing method of memory structures 800 includes such as the following steps. Through openings are formed by an etching process. These through openings vertically penetrate through the material layers 230 and the insulating layers 220 in the horizontal extended region H of the stacked structure 5200, and this etching process has no etching selectivity with respect to the material layers 230 and the insulating layers 220. Then, memory layers 810 are formed on the sidewalls of the through openings, channel layers 820 are formed on the memory layers 810, and then insulating materials 830 are filled in the through openings and formed on the channel layers 820. In the embodiment, as shown in FIG. 8C, the through openings extend vertically downward into the substrate 100. In an alternative embodiment, the through openings may extend vertically downward and stop at the surface of the substrate 100 (not shown in drawings).

In the embodiment, the memory layer 810 is such as a composite layer of silicon oxide-silicon nitride-silicon oxide (ONO), a composite layer of silicon oxide-silicon nitride-silicon oxide-silicon nitride-silicon oxide (ONONO), or a composite layer of silicon oxide-silicon nitride-silicon oxide-silicon nitride-silicon oxide-silicon nitride-silicon oxide (ONONONO), but not limited thereto. The channel layer 820 is such as undoped polysilicon. The insulating material 830 is such as silicon oxide, silicon nitride, or other suitable dielectric material.

In an embodiment, the memory structure 800 can be all formed in the horizontal extended region H (not shown in drawings). In an embodiment, as shown in FIG. 8C, some of the memory structures 800 may be formed in the etching stop structure 300.

As shown in FIGS. 9-12B, the first filled slit groove 410 is formed in the stacked structure 200, wherein the conductive layers 210 and the insulating layers 220 in the vertical extended region V are located between the etching stop structure 300 and the first filled slit groove 410. In the embodiment, as shown in FIGS. 9-12B, the second filled slit groove 420 may be further formed in the stacked structure 200, wherein the etching stop structure 300 is located between the first filled slit groove 410 and the second filled slit groove 420. The manufacturing method of forming the first filled slit groove 410, the second filled slit groove 420, and the conductive layers 210 of the stacked structure 200 includes such as the following steps.

Figure 9:
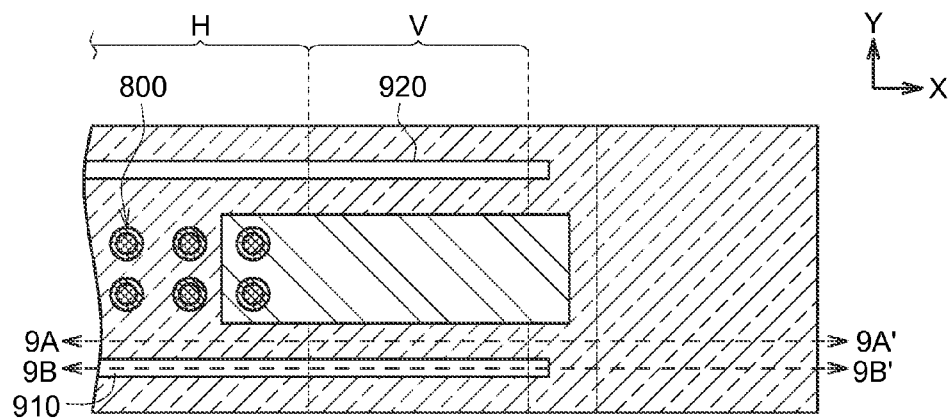
Figure 9A:
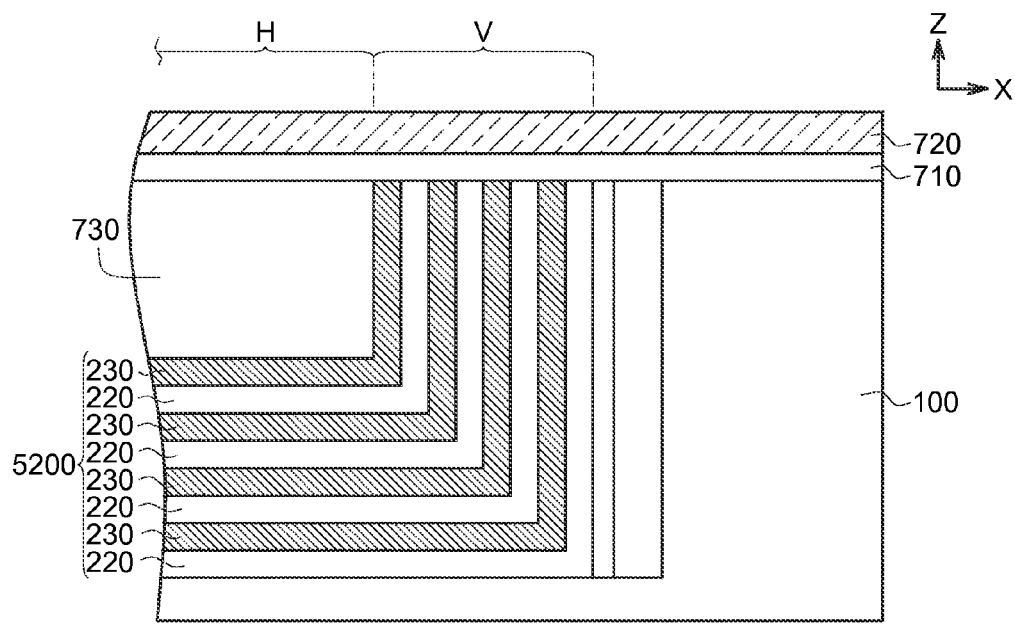
Figure 9B:
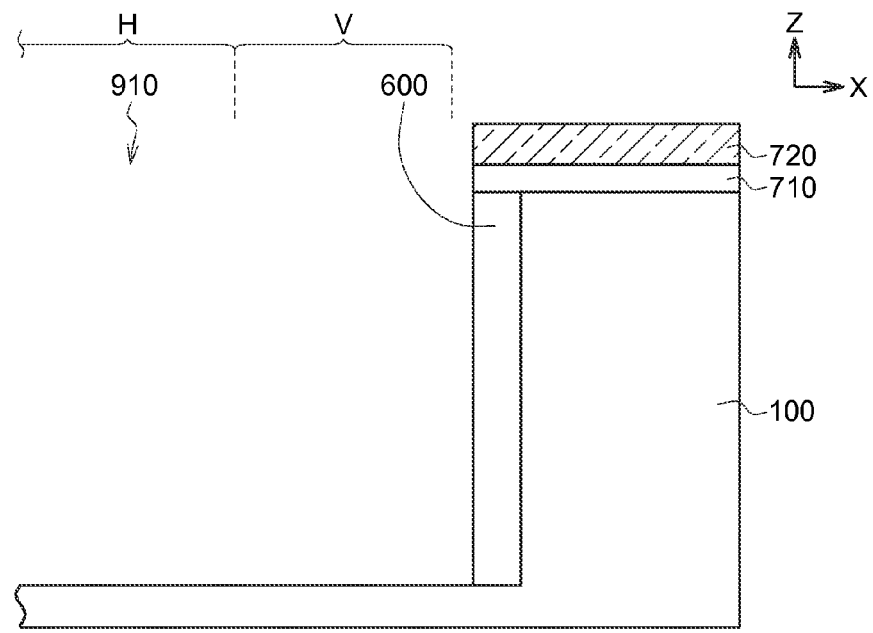

FIG. 9A is a cross-sectional view along the cross-sectional line 9A-9A' in FIG. 9, and FIG. 9B is a cross-sectional view along the cross-sectional line 9B-9B' in FIG. 9. As shown in FIGS. 9-9B, a first slit groove 910 and a second slit groove 920 are formed in the stacked structure 5200. The first slit groove 910 and the second slit groove 920 penetrate through the material layers 230 and the insulating layers 220 in the vertical extended region V and the horizontal extended region H of the stacked structure 5200. In the embodiment, the first slit groove 910 and the second slit groove 920 are formed by such as an etching process, and this etching process has no selectivity with respect to the material layers 230 and the insulating layers 220.

Figure 10:
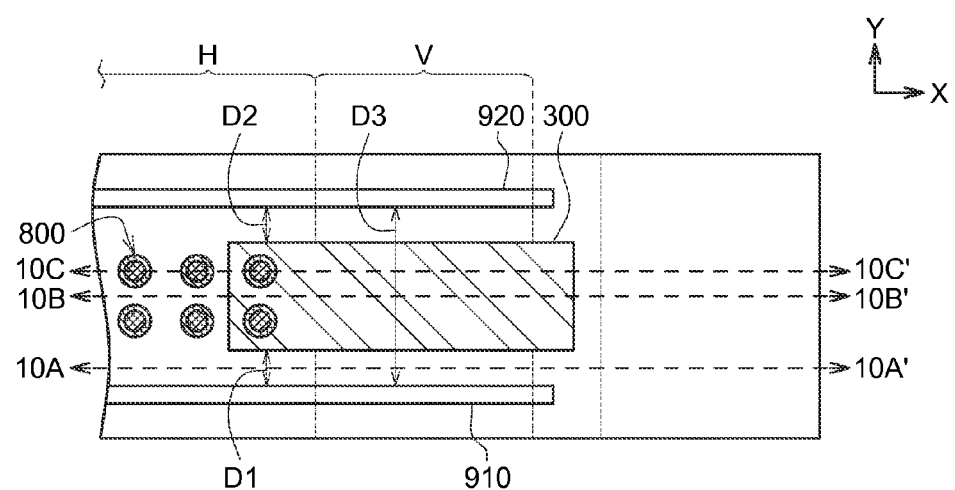
Figure 10A:
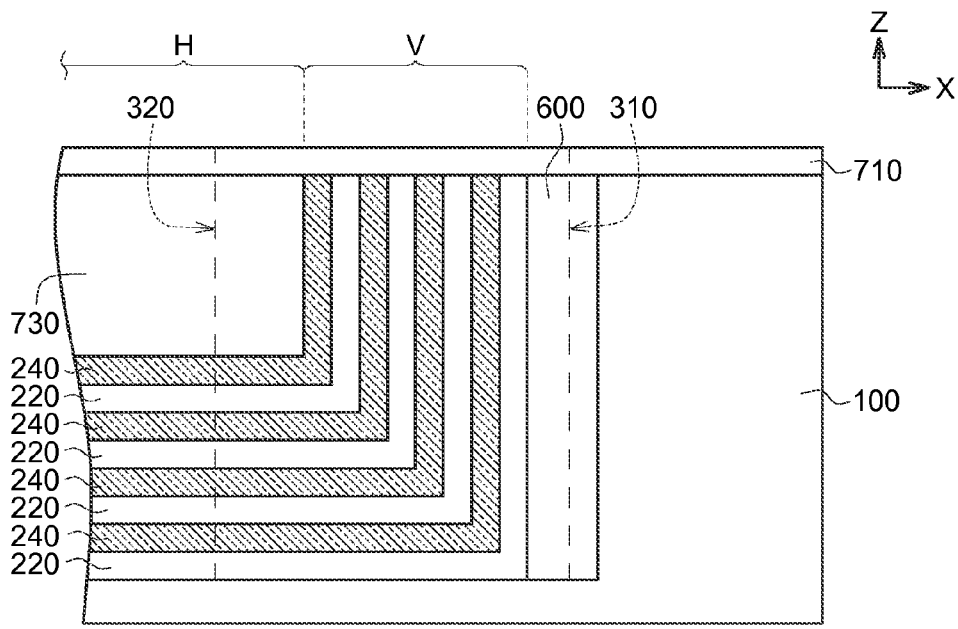
Figure 10B:
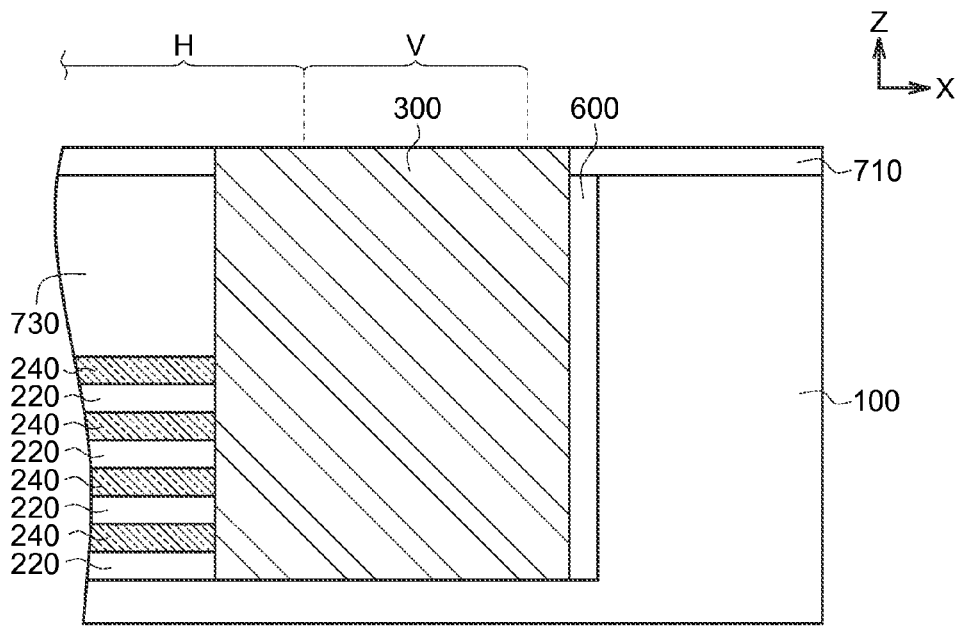
Figure 10C:
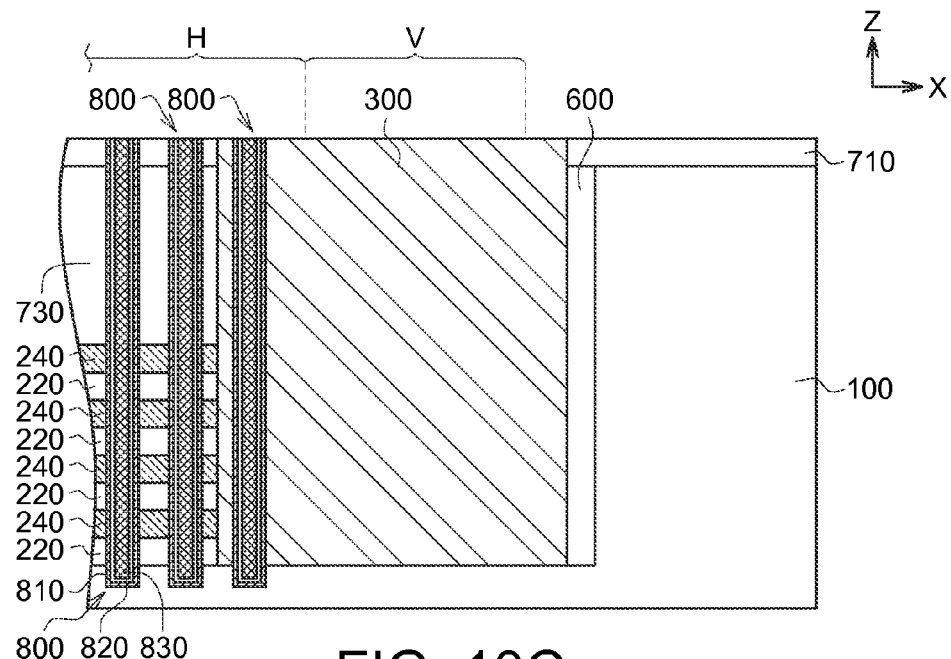

FIG. 10A is a cross-sectional view along the cross-sectional line 10A-10A' in FIG. 10, FIG. 10B is a cross-sectional view along the cross-sectional line 10B-10B' in FIG. 10, and FIG. 100 is a cross-sectional view along the cross-sectional line 10C-10C' in FIG. 10. As shown in FIGS. 10-10C, the material layers 230 in the vertical extended region V are removed.

As shown in FIGS. 10-10C, in the present embodiment, the material layers 230 are such as sacrificial layers. Phosphoric acid ($H_3PO_4$) solution is used as an etching solution. Phosphoric acid solution is introduced through the first slit groove 910 and the second slit groove 920 to remove the material layers 230 in the vertical extended region V and the horizontal extended region H for forming voids 240. Meantime, the etching solution may remove the hard mask layer 720 as well.

As shown in FIGS. 10-10C, due to the fact that the width D3 of the horizontal extended region H along the Y direction may be very long, for example, about 1000 μm, an over-etching process of the etching solution is required to fully remove all of the material layers 230 (sacrificial layers) located between the first slit groove 910 and the second slit groove 920 in the horizontal extended region H. In the current step, since the vertical memory structures 800 penetrate through the horizontal extended region H, the insulating layers 220 separated by the voids 240 may be supported by the vertical memory structures 800. As a result, all of the material layers 230 can be etched and removed by introducing the etching solution through the first slit groove 910 and the second slit groove 920 to undergo an over-etching process, and the insulating layers 220 separated by the voids 240 can be supported by the vertical memory structures 800 and would not collapse.

As shown in FIGS. 10-10C, compared to the width D1 of the horizontal extended region H along the Y direction, the distances D1 and D2 between the etching stop structure 300 and the first slit groove 910 and the second slit groove 902 respectively in the vertical extended region V are relatively much shorter, for example, 20-200 nm. In comparison to the situation where no etching stop structure 300 is arranged, after the vertically-extended material layers 230 in the vertical extended region V are removed, the remained vertically-extended insulating layers 220 separated by the voids 420 may easily deform or even collapse. According to the embodiments of the present disclosure, the distances D1 and D2 are relatively short, such that the material layers 230 in the vertical extended region V can be easily fully removed by the over-etching of the etching solution, and the over-etching can stop at the etching stop structure 300. Furthermore, the separated insulating layers 220 extend vertically and are formed on the etching stop structure 300; that is, the insulating layers 220 are in direct contact with the etching stop structure 300, such that the insulating layers 220 can be nicely supported by the etching stop structure 300, the insulating layers 220 would not deform or collapse, and thus the whole structure can be stabilized in the manufacturing process.

In another embodiment, the material layers 230 are such as conductive material layers, for example, including polysilicon. In such case, the over-etching level of the etching solution can be adjusted to fully remove merely the material layers 230 in the vertical extended region V, stopping at the etching stop structure 300, and partially remove the material layers 230 adjacent to the first slit groove 910 and the second slit groove 920 in the horizontal extended region H (not shown in drawings). As such, the insulating layers 220 in the vertical extended region V can still be nicely supported by the etching stop structure 300, the insulating layers 220 would not deform or collapse, and thus the whole structure can be stabilized in the manufacturing process.

Figure 11:
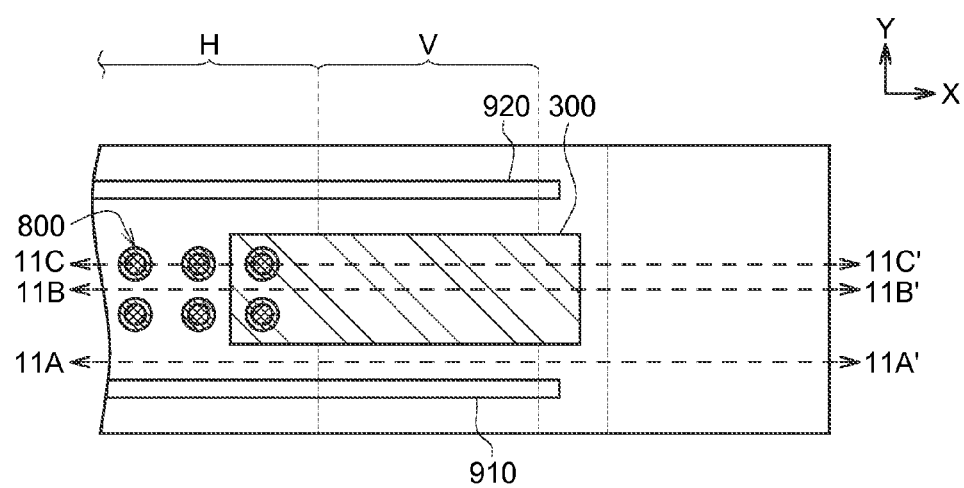
Figure 11A:
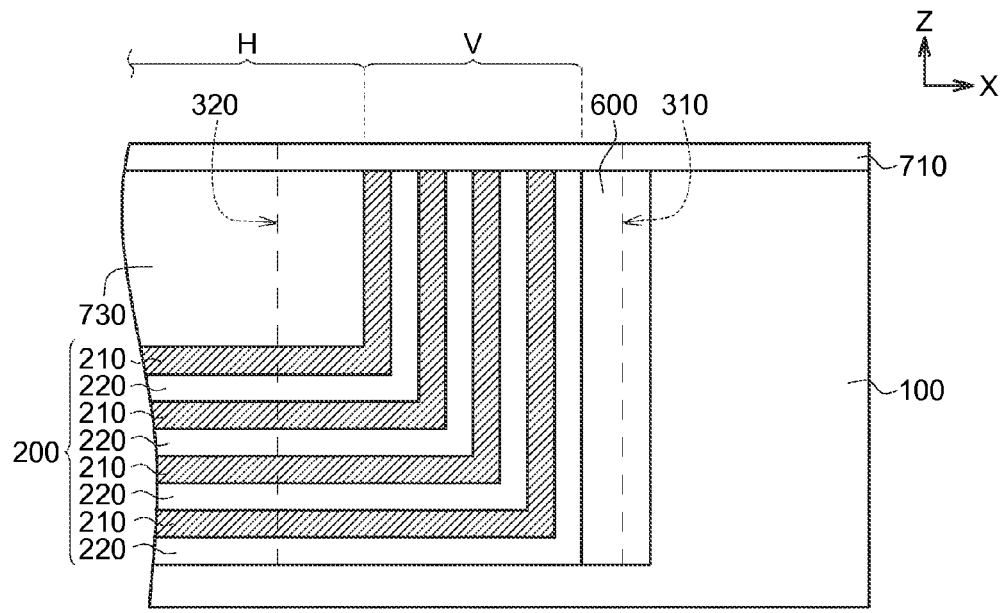
Figure 11B:
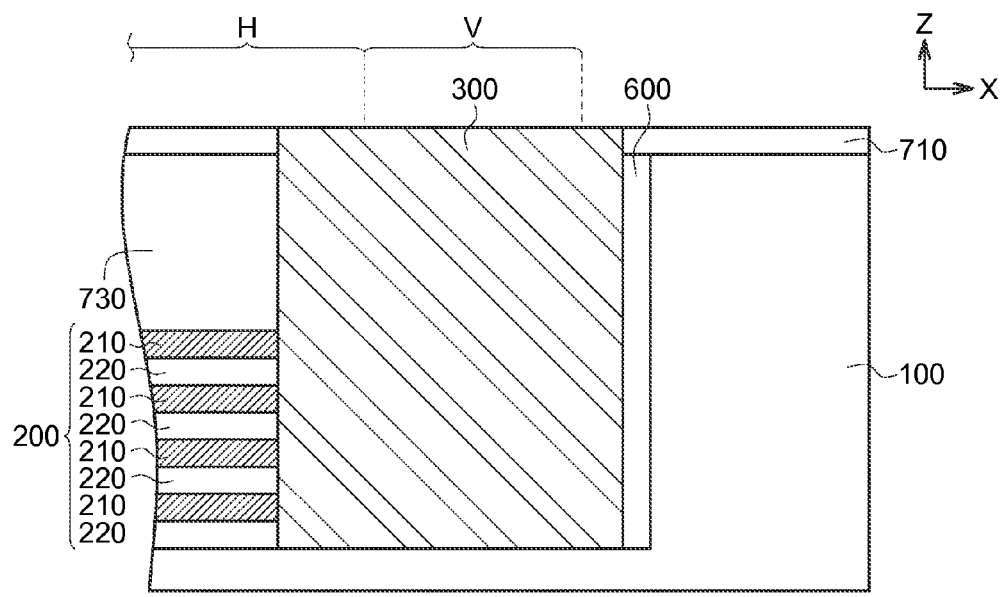
Figure 11C:
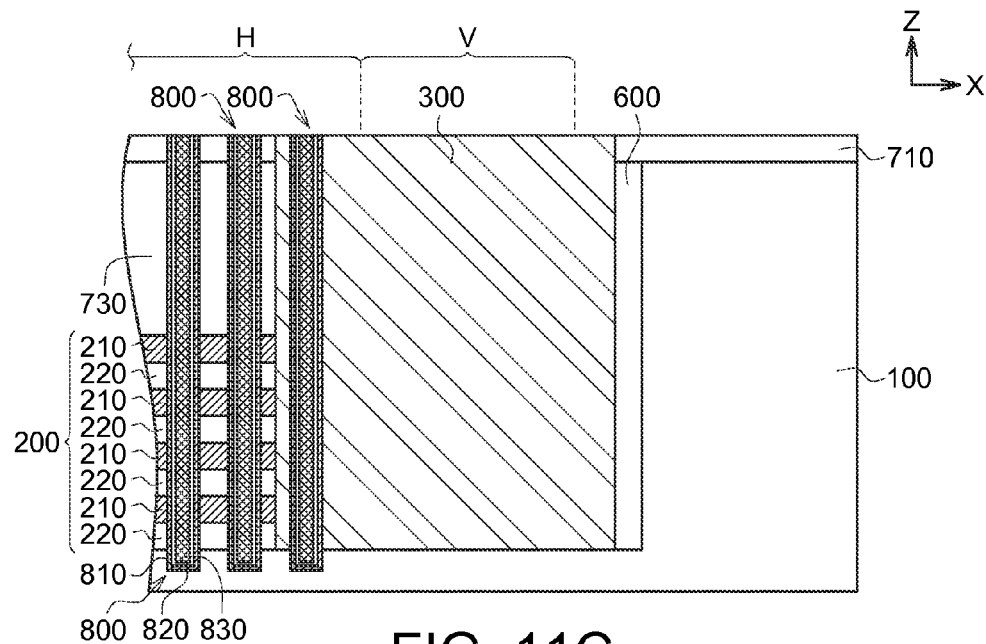

FIG. 11A is a cross-sectional view along the cross-sectional line 11A-11A' in FIG. 11, FIG. 11B is a cross-sectional view along the cross-sectional line 11B-11B' in FIG. 11, and FIG. 11C is a cross-sectional view along the cross-sectional line 11C-11C' in FIG. 11. As shown in FIGS. 11-110, the conductive layers 210 are formed.

In the present embodiment, for example, the conductive layers 210 are formed by introducing a conductive material through the first slit groove 910 and the second slit groove 920 for filling the conductive material in the voids 240 which are formed by removal of the material layers 230 in the vertical extended region V and the horizontal extended region H.

As shown in FIGS. 11-11C, the conductive material is introduced into the voids 240 through the first slit groove 910 and the second slit groove 920. For example, a material layer having high dielectric constant is formed on the outer walls of the memory structures 800 in the voids 240 and on the inner walls of the voids 240 by a deposition process. The material layer having high dielectric constant may include aluminum oxide ($AlO_x$) or hafnium oxide ($HfO_2$). Next, a conductive filler is formed on the material layer having high dielectric constant and fills in the voids 240. In the embodiment, the conductive filler includes such as titanium nitride and tungsten, wherein the titanium nitride layer is formed on the material layer having high dielectric constant, and tungsten is formed on the titanium nitride layer and fills in the voids 240.

Next, an etching solution is introduced through the first slit groove 910 and the second slit groove 920 to remove the conductive filler extruded from the voids 240 into the first slit groove 910 and the second slit groove 920, such that the conductive filler portions in different voids 240 are separated and electrically insulated from one another, thereby forming the conductive layers 210. As such, the stacked structure 200 is formed.

In an alternative embodiment, the material layers 230 are such as conductive material layers, for example, including polysilicon. The material layers 230 in the horizontal extended region H are not fully removed, and the conductive material is introduced into the voids 240 in the vertical extended region V, these voids 240 being formed by removal of material layers 230 in the vertical extended region V, through the first slit groove 910 and the second slit groove 920. As such, the conductive material filled in the voids 240 in the vertical extended region V and the material layers 230 (conductive material layers) in the horizontal extended region H form the conductive layers 210.

Figure 12:
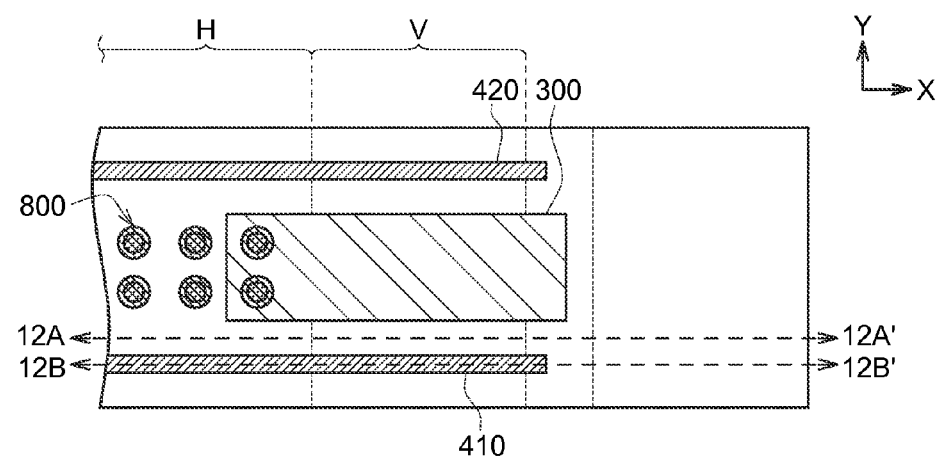
Figure 12A:
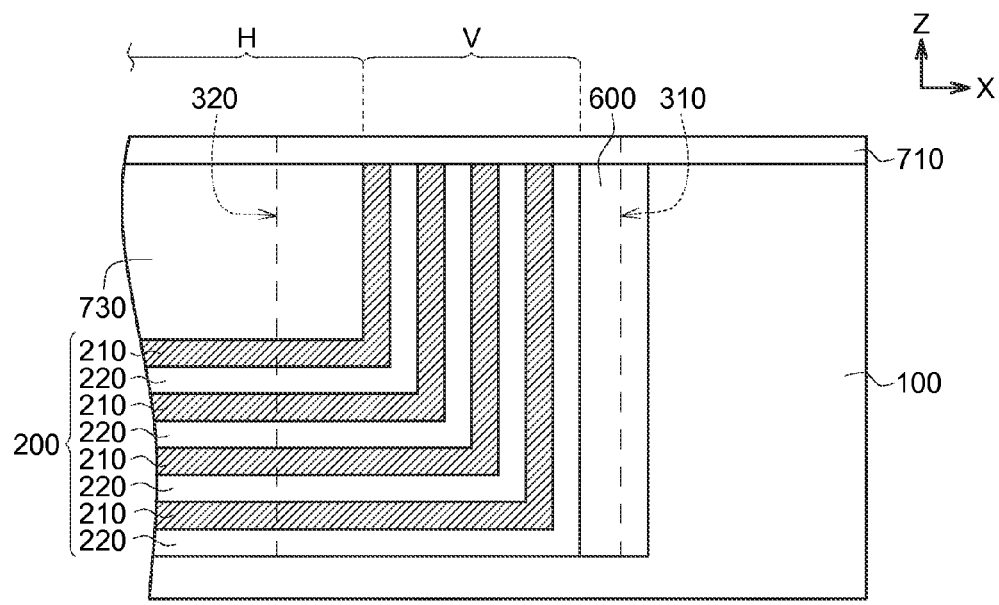
Figure 12B:
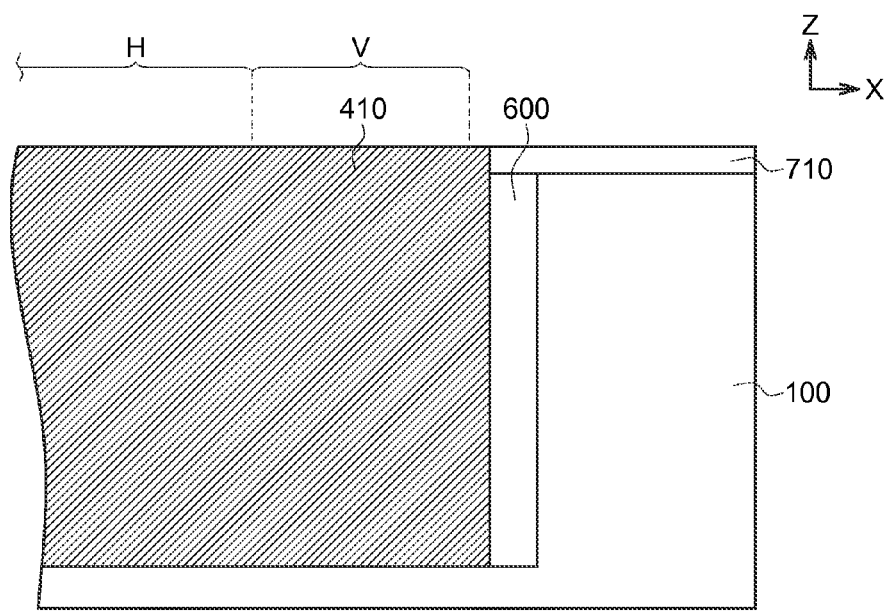

FIG. 12A is a cross-sectional view along the cross-sectional line 12A-12A' in FIG. 12, and FIG. 12B is a cross-sectional view along the cross-sectional line 12B-12B' in FIG. 12. As shown in FIGS. 12-12B, the first filled silt groove 410 and the second filled slit groove 420 are formed.

In an embodiment, for example, an insulating layer is formed on the surfaces of the slit grooves by a deposition process. Next, a conductive filler is formed on the insulating layer and fills in the slit grooves. The insulating layer may include $SiO_2$, SiN, or a lower K dielectric material. The conductive filler includes such as titanium nitride and tungsten, wherein the titanium nitride layer is formed on the insulating layer, and tungsten is formed on the titanium nitride layer and fills in the slit grooves.

In an alternative embodiment, for example, an insulating filled is filled into the first slit groove 910 and the second slit groove 920 for forming the first filled slit groove 410 and the second filled slit groove 420.

In the embodiment, after the conductive filler or the insulating filled is filled into the first slit groove 910 and the second slit groove 920, a CMP process may be performed for planarizing the top surfaces of the first filled slit groove 410 and the second filled slit groove 420.

Figure 13:
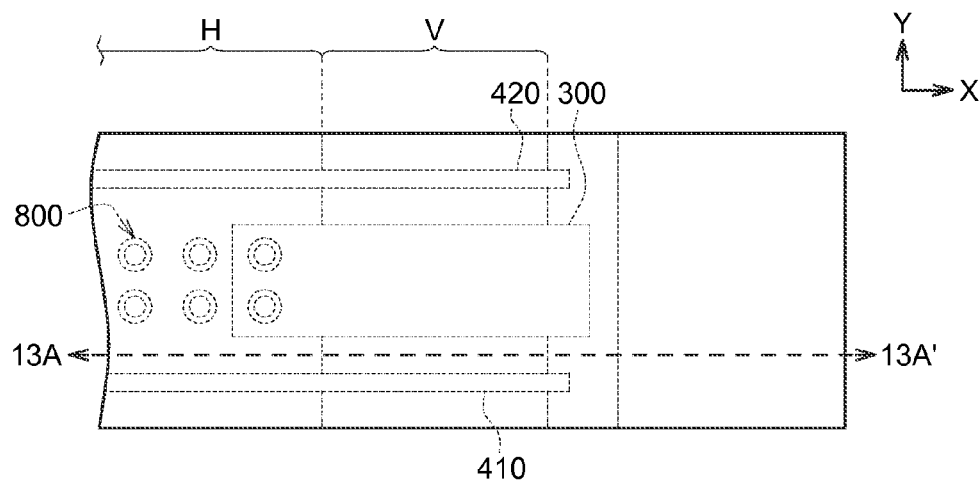
Figure 13A:
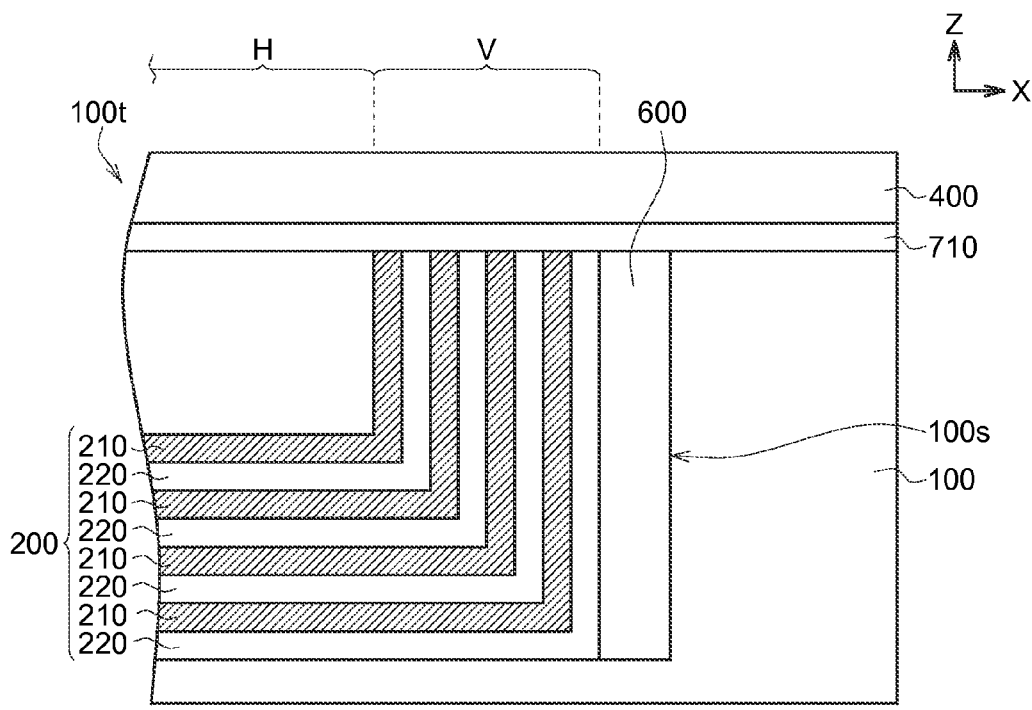

FIG. 13A is a cross-sectional view along the cross-sectional line 13A-13A' in FIG. 13. As shown in FIGS. 13-13A, the dielectric structure 400 is formed on the substrate 100 and the stacked structure 200.

Referring FIGS. 1 and 2A-2C, contact plugs 510/520 are formed in the dielectric structure 400, wherein each of the contact plugs 510/520 is electrically connected to each of the conductive layers 210 in the vertical extended region V of the stacked structure 200 respectively. For example, the contact plugs 510 located adjacent to the first filled slit groove 410 are electrically connected to the odd-numbered conductive layers 210, and the contact plugs 520 located adjacent to the second filled slit groove 420 are electrically connected to the even-numbered conductive layers 210. As such, compared to the design of arranging all of the contact plugs at the same side along the same row, according to the embodiments of the present disclosure, the contact plugs 510/520 are interlacedly electrically connected to every other conductive layers 210, such that the pitch of the contact plugs along the X direction can be enlarged, and the occurring of misalign errors in the manufacturing process can be reduced.

In a process for manufacturing a semiconductor structure according to another embodiment of the present disclosure, referring to FIGS. 1A and 6-7B, a plurality of the trenches 6300 may be formed in the vertical extended region V of the stacked structure 5200, followed by filling an etching stop material into the trenches 6300 for forming the etching stop blocks 300'. As such, the semiconductor structure 20 as shown in FIG. 1A is formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate having a trench;
   a stacked structure having a horizontal extended region and a vertical extended region extending along a sidewall of the trench, wherein the stacked structure comprises a plurality of conductive layers and a plurality of insulating layers interlacedly stacked in the trench;
   an etching stop structure formed in the vertical extended region;
   a plurality of memory structures vertically penetrating through the conductive layers and the insulating layers in the horizontal extended region of the stacked structure; and
   a first filled slit groove formed in the stacked structure, wherein the conductive layers and the insulating layers in the vertical extended region are formed on the etching stop structure and located between the etching stop structure and the first filled slit groove.

2. The semiconductor structure according to claim 1, wherein a first sidewall of the etching stop structure is adjacent to the sidewall of the trench.

3. The semiconductor structure according to claim 1, wherein the etching stop structure and the first filled slit groove are separated by 20-200 nm.

4. The semiconductor structure according to claim 1, wherein a second sidewall of the etching stop structure is located in the horizontal extended region of the stacked structure.

5. The semiconductor structure according to claim 1, wherein a bottom surface of the etching stop structure is in direct contact with a bottom surface of the trench.

6. The semiconductor structure according to claim 1, further comprising:
   a dielectric structure formed on the substrate and the stacked structure; and
   a plurality of contact plugs formed in the dielectric structure, wherein each of the contact plugs is electrically connected to each of the conductive layers in the vertical extended region of the stacked structure respectively.

7. The semiconductor structure according to claim 1, further comprising:
   a second filled slit groove formed in the stacked structure, wherein the etching stop structure is located between the first filled slit groove and the second filled slit groove.

8. The semiconductor structure according to claim 7, wherein the conductive layers and the insulating layers in the vertical extended region are further located between the etching stop structure and the second filled slit groove.

9. The semiconductor structure according to claim 7, wherein the etching stop structure comprises a plurality of etching stop blocks, and the etching stop block located nearest to the second filled slit groove is separated from the second filled slit groove by 20-200 nm.

10. The semiconductor structure according to claim 1, wherein the conductive layers in the horizontal extended region comprise polysilicon, tungsten, or a combination of both, and the conductive layers in the vertical extended region comprise tungsten.

11. A manufacturing method of a semiconductor structure, comprising:
    providing a substrate having a trench;
    forming a stacked structure having a horizontal extended region and a vertical extended region extending along a sidewall of the trench, wherein the stacked structure comprises a plurality of conductive layers and a plurality of insulating layers interlacedly stacked in the trench;
    forming an etching stop structure in the vertical extended region;
    forming a plurality of memory structures vertically penetrating through the conductive layers and the insulating layers in the horizontal extended region of the stacked structure; and
    forming a first filled slit groove in the stacked structure, wherein the conductive layers and the insulating layers in the vertical extended region are formed on the etching stop structure and located between the etching stop structure and the first filled slit groove.

12. The manufacturing method of the semiconductor structure according to claim 11, wherein a first sidewall of the etching stop structure is adjacent to the sidewall of the trench.

13. The manufacturing method of the semiconductor structure according to claim 11, wherein the etching stop structure and the first filled slit groove are separated by 20-200 nm.

14. The manufacturing method of the semiconductor structure according to claim 11, wherein a second sidewall of the etching stop structure is located in the horizontal extended region of the stacked structure.

15. The manufacturing method of the semiconductor structure according to claim 11, wherein a bottom surface of the etching stop structure is in direct contact with a bottom surface of the trench.

16. The manufacturing method of the semiconductor structure according to claim 11, further comprising:
    forming a dielectric structure on the substrate and the stacked structure; and
    forming a plurality of contact plugs in the dielectric structure, wherein each of the contact plugs is electrically connected to each of the conductive layers in the vertical extended region of the stacked structure respectively.

17. The manufacturing method of the semiconductor structure according to claim 11, further comprising:
    forming a second filled slit groove in the stacked structure, wherein the etching stop structure is located between the first filled slit groove and the second filled slit groove.

18. The manufacturing method of the semiconductor structure according to claim 17, wherein the conductive layers and the insulating layers in the vertical extended region are further located between the etching stop structure and the second filled slit groove.

19. The manufacturing method of the semiconductor structure according to claim 17, wherein forming the etching stop structure comprises:
    forming a plurality of etching stop blocks, wherein the etching stop block located nearest to the second filled slit groove is separated from the second filled slit groove by 20-200 nm.

20. The manufacturing method of the semiconductor structure according to claim 11, wherein the conductive layers in the horizontal extended region comprise polysilicon, tungsten, or a combination of both, and the conductive layers in the vertical extended region comprise tungsten.

* * * * *